US008288751B2

(12) United States Patent
Noda et al.

(10) Patent No.: US 8,288,751 B2
(45) Date of Patent: Oct. 16, 2012

(54) SEMICONDUCTOR MEMORY DEVICE AND MANUFACTURING METHOD OF THE SAME

(75) Inventors: Mitsuhiko Noda, Yokohama (JP); Mitsuhiro Noguchi, Yokohama (JP); Hiroomi Nakajima, Yokohama (JP); Masato Endo, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 276 days.

(21) Appl. No.: 12/759,107

(22) Filed: Apr. 13, 2010

(65) Prior Publication Data

US 2010/0258783 A1  Oct. 14, 2010

(30) Foreign Application Priority Data

Apr. 14, 2009  (JP) .................................. 2009-098302

(51) Int. Cl.
*H01L 27/11* (2006.01)
(52) U.S. Cl. ...... 257/5; 257/374; 257/379; 257/E45.002; 257/E29.33
(58) Field of Classification Search .............. 257/5, 374, 257/379, E45.002, E29.33
See application file for complete search history.

(56) References Cited

U.S. PATENT DOCUMENTS

| 5,514,889 A | 5/1996 | Cho et al. |
| 2007/0121381 A1* | 5/2007 | Kalnitsky et al. ........ 365/185.18 |
| 2008/0258129 A1 | 10/2008 | Toda |

FOREIGN PATENT DOCUMENTS

| JP | 11-163290 | 6/1999 |
| JP | 2005-522045 | 7/2005 |

OTHER PUBLICATIONS

U.S. Appl. No. 12/785,843, filed May 24, 2010, Ishihara, et al.

* cited by examiner

*Primary Examiner* — Minh-Loan T Tran
(74) *Attorney, Agent, or Firm* — Oblon, Spivak, McClelland, Maier & Neustadt, L.L.P.

(57) ABSTRACT

A semiconductor memory device includes a plurality of memory cell arrays each includes a plurality of memory cells, the plurality of memory cell arrays being stacked on a semiconductor substrate to form a three-dimensional structure, a first well formed in the semiconductor substrate and having a first conductivity type, an element isolation insulating film including a bottom surface shallower than a bottom surface of the first well in the first well, and buried in the semiconductor substrate, a second well including a bottom surface shallower than the bottom surface of the first well in the first well, formed along a bottom surface of at least a portion of the element isolation insulating film, and made of an impurity having a second conductivity type, and a contact line electrically connected to the first well.

11 Claims, 15 Drawing Sheets

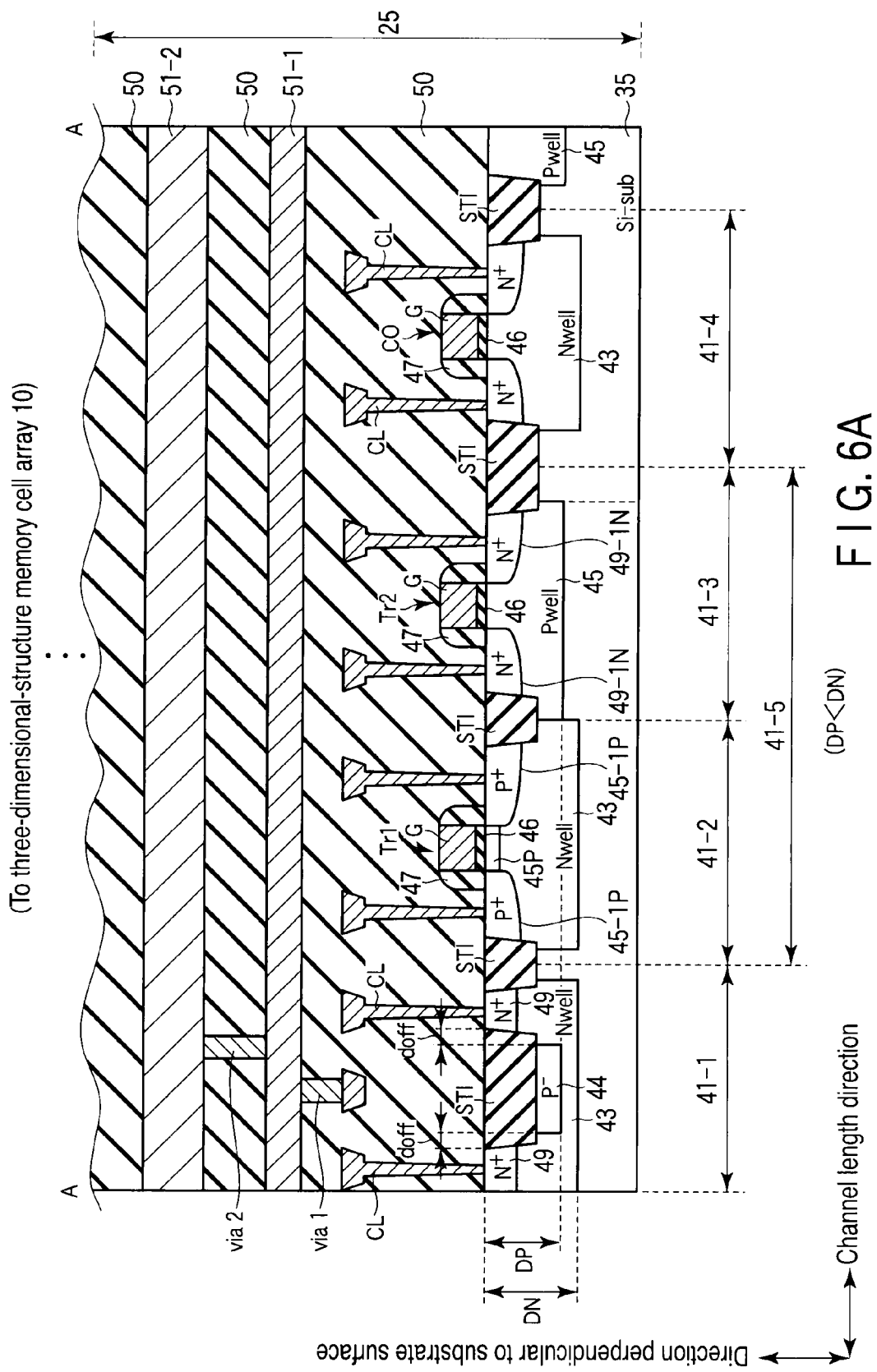
F I G. 6A

N-Well Resistance Formation Region

Manufacturing Method (First Embodiment)

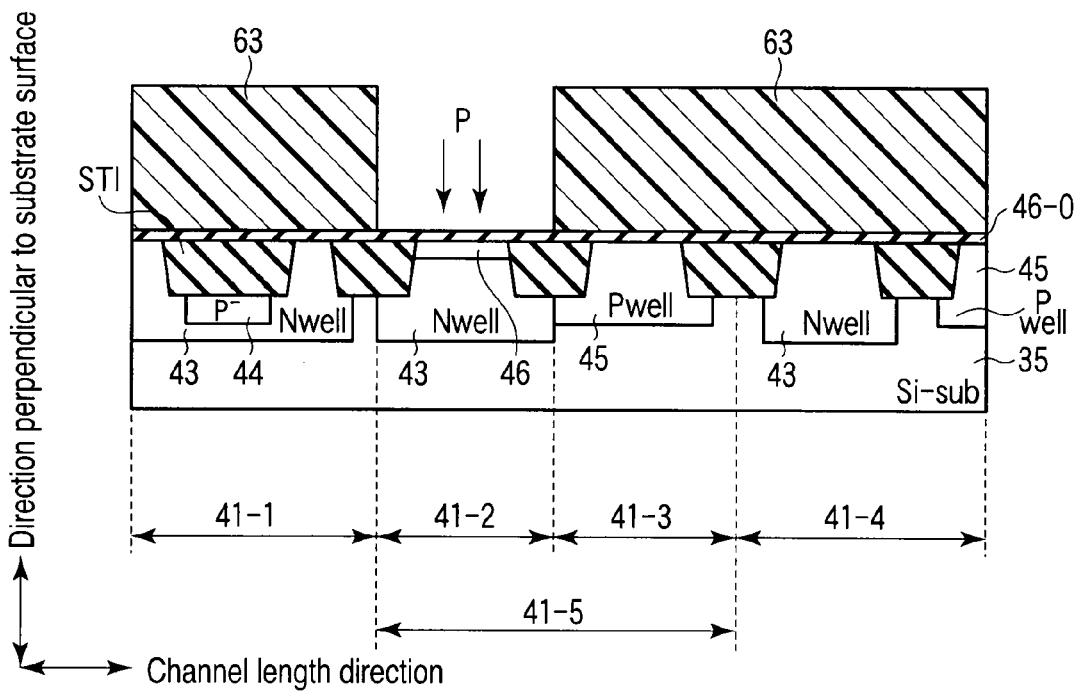
F I G. 15
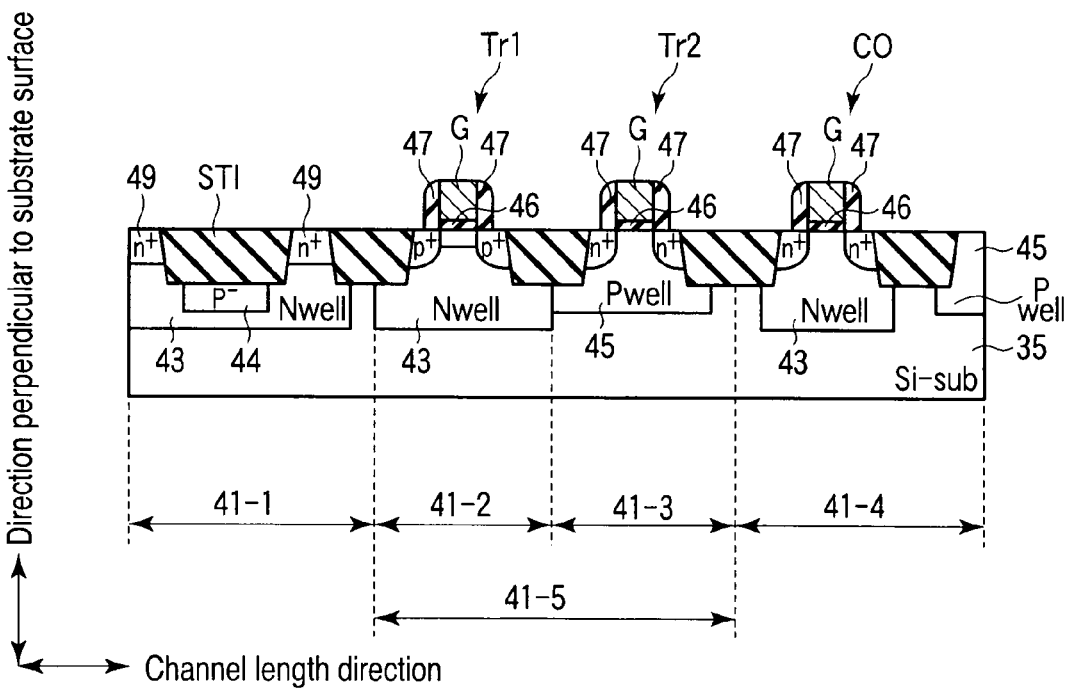
F I G. 16A

Modification (When Electrons Can Pass Without Offset)

Manufacturing Method (Comparative Example)
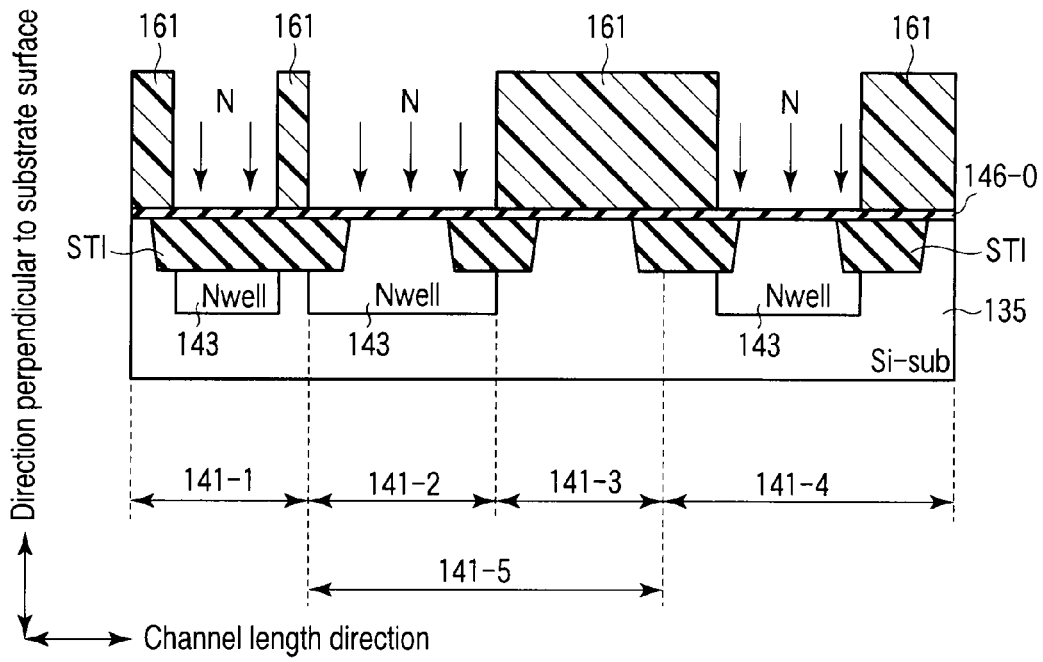
F I G. 18
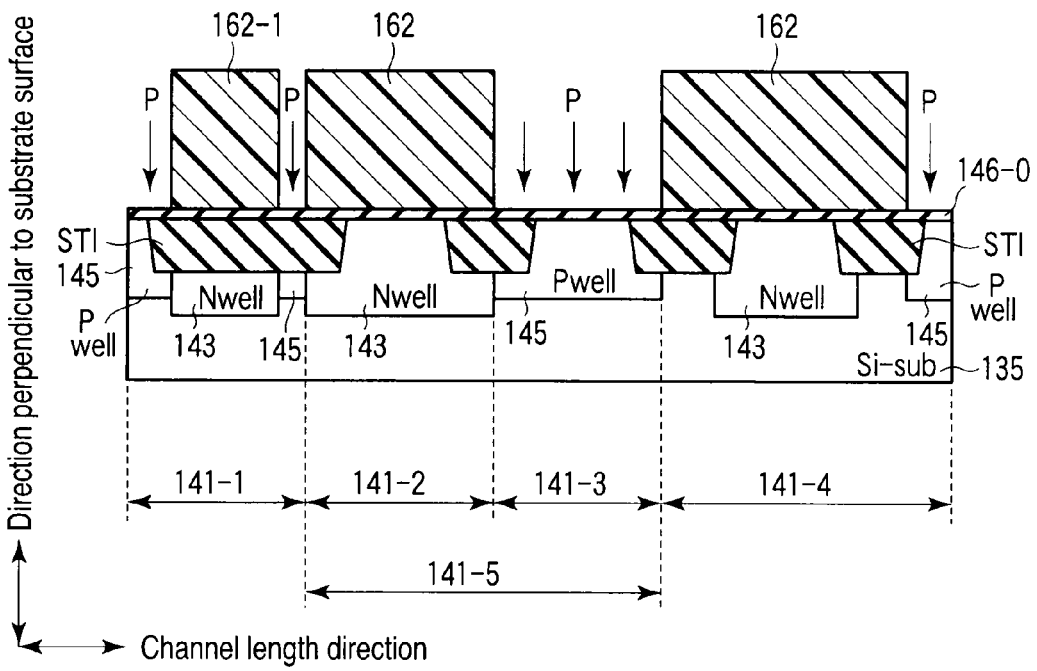
F I G. 19

SEMICONDUCTOR MEMORY DEVICE AND MANUFACTURING METHOD OF THE SAME

CROSS-REFERENCE TO RELATED APPLICATIONS

This application is based upon and claims the benefit of priority from prior Japanese Patent Application No. 2009-098302, filed Apr. 14, 2009, the entire contents of which are incorporated herein by reference.

BACKGROUND OF THE INVENTION

1. Field of the Invention

The present invention relates to a semiconductor memory device and a manufacturing method of the same.

2. Description of the Related Art

Next-generation semiconductor memories such as an FeRAM (Ferroelectric Random Access Memory), MRAM (Magnetic Random Access Memory), and ReRAM (Resistance Random Access Memory) each include a plurality of memory cells. A semiconductor memory device having a three-dimensional structure in which a plurality of memory cell layers are stacked on a semiconductor substrate has been proposed as one of these semiconductor memories (e.g., Jpn. Pat. Appln. KOKAI Publication No. 2005-522045).

BRIEF SUMMARY OF THE INVENTION

A semiconductor memory device according to an aspect of the present invention comprises a plurality of memory cell arrays each comprising a plurality of memory cells, the plurality of memory cell arrays being stacked on a semiconductor substrate to form a three-dimensional structure; a first well formed in the semiconductor substrate and having a first conductivity type; an element isolation insulating film including a bottom surface shallower than a bottom surface of the first well in the first well, and buried in the semiconductor substrate; a second well including a bottom surface shallower than the bottom surface of the first well in the first well, formed along a bottom surface of at least a portion of the element isolation insulating film, and made of an impurity having a second conductivity type; and a contact line electrically connected to the first well.

A method of manufacturing a semiconductor memory device according to an aspect of the present invention comprises: burying an element isolation insulating film in a semiconductor substrate; forming a first well by doping an impurity having a first conductivity type in the semiconductor substrate, such that a bottom surface of the first well exists in a position deeper than the element isolation insulating film, and the first well surrounds the element isolation insulating film; forming a second well having a second conductivity type by overlappingly doping an impurity having a second conductivity type in the first well, such that a bottom surface of the second well is shallower than the bottom surface of the first well, and the second well is formed at a position defined along a bottom surface of at least a portion of the element isolation insulating film, and simultaneously doping the impurity having the second conductivity type in a transistor formation region; and forming a third well by doping an impurity having the first conductivity type in a surface region of the first well.

BRIEF DESCRIPTION OF THE SEVERAL VIEWS OF THE DRAWING

FIG. 6A is a sectional view showing a configuration example of a substrate surface region taken along a line A-A in FIG. 2;

FIG. 15 is a sectional view showing still another manufacturing step of the semiconductor memory device according to the first embodiment;

FIG. 16A is a sectional view showing still another manufacturing step of the semiconductor memory device according to the first embodiment;

FIG. 18 is a sectional view showing a manufacturing step of a semiconductor memory device according to a comparative example of the present invention;

FIG. 19 is a sectional view showing another manufacturing step of the semiconductor memory device according to the comparative example of the present invention;

DETAILED DESCRIPTION OF THE INVENTION

Figure 1:
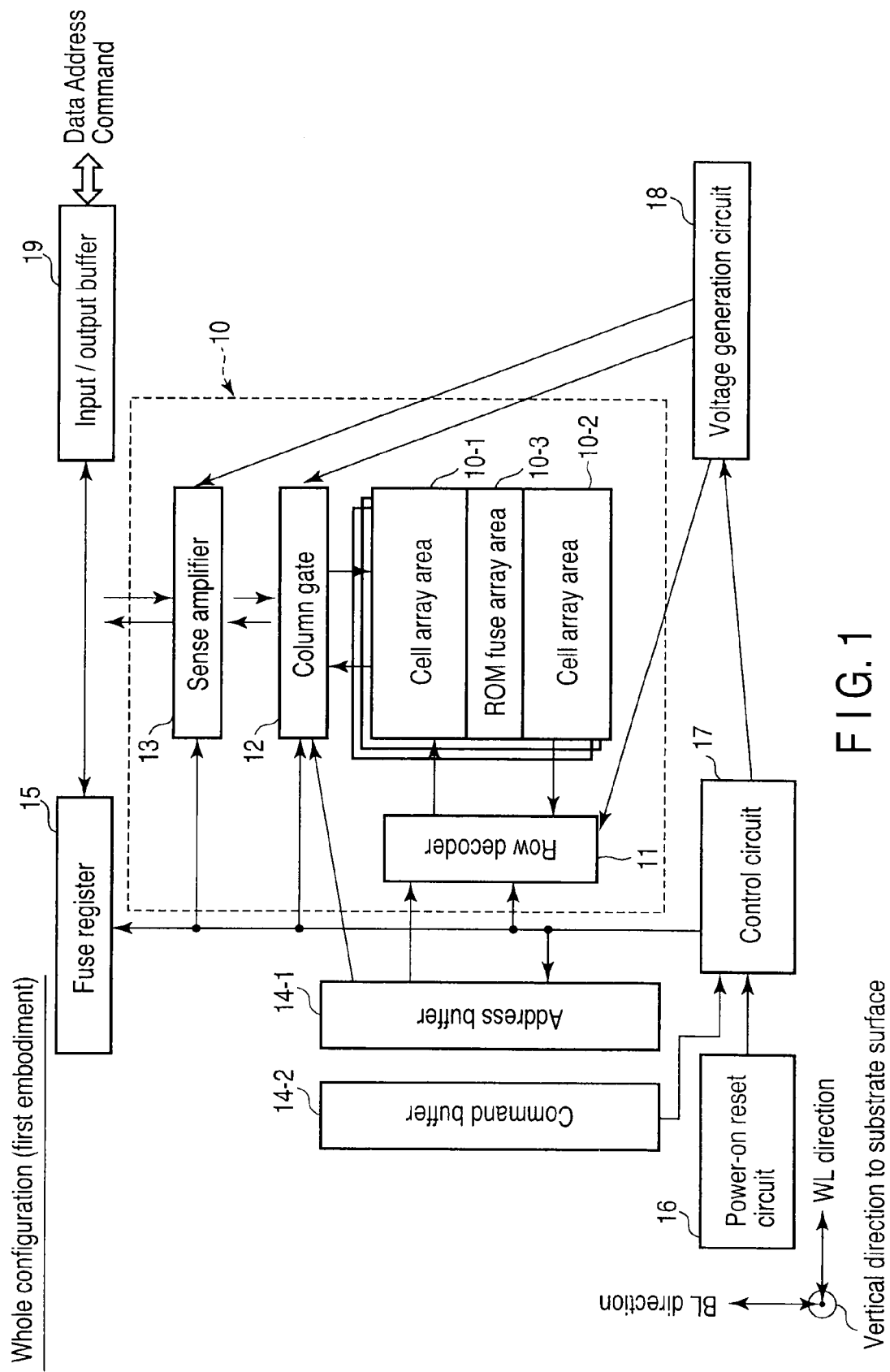
FIG. 1 is a view showing the overall configuration of a semiconductor memory device according to the first embodiment of the present invention.

Even in the semiconductor memory device having the three-dimensional structure described above, a peripheral circuit is essential in order to switch data erase, program, and read.

In the semiconductor memory device having the three-dimensional structure, however, the power consumption may increase as the degree of integration increases. Therefore, it makes a configuration and a manufacture ring method of the peripheral circuit in the semiconductor memory device advantageous structure against the increase in power consumption.

Embodiments of the present invention will be explained below with reference to the accompanying drawing. Note that in the following explanation, the same reference numerals denote the same parts throughout the drawing.

First Embodiment

ReRAM

First, a semiconductor memory device and a control method of the same according to the first embodiment of the present invention will be explained below with reference to FIGS. 1, 2, 3, 4, 5, 6A, 6B, 7, 8, 9, 10, 11, 12, 13, and 14. In this embodiment, a ReRAM (Resistance Random Access Memory) will be explained as an example of a semiconductor memory device in which memory cells are randomly accessed.

<1. Configuration Example>
1-1. Overall Configuration Example

First, an example of the overall configuration of the semiconductor memory device according to the first embodiment will be explained below with reference to FIG. 1.

As shown in FIG. 1, the semiconductor memory device according to this embodiment includes a memory cell array 10, row decoder 11, column gate 12, sense amplifier 13, address buffer 14-1, command buffer 14-2, fuse register 15, power on reset circuit 16, controller 17, voltage generator 18, and input/output buffer 19.

The memory cell array 10 includes memory cell array areas 10-1 and 10-2 each including a plurality of memory cells to be randomly accessed arranged in a matrix at the intersections of a plurality of bit lines and a plurality of word lines, and a ROM Fuse array area 10-3. Also, the memory cell array 10 has a three-dimensional structure in which a plurality of memory cell arrays are stacked in a direction perpendicular to the substrate surface of a semiconductor substrate as will be described later.

The row decoder 11 decodes addresses in the row direction (WL direction). Also, the row decoder 11 includes a driver for driving the word lines.

The column gate 12 decodes addresses in the column direction (BL direction). Also, the column gate 12 includes a driver for driving the bit lines. In this embodiment, although not shown in FIG. 1, column gates 12 are arranged in the upper and lower portions of the memory cell array 10 as will be described later.

The sense amplifier 13 is electrically connected to the column gate 12 and bit lines, and reads out data from the memory cells. In this embodiment, although not shown in FIG. 1, sense amplifiers 13 are arranged in the upper and lower portions of the memory cell array 10. The number of the sense amplifiers 13 is a plurality of number of times larger than the number of bits of I/O pins 0 to 7 (to be described later).

The address buffer 14-1 is electrically connected to the row decoder 11 and column gate 12, and temporarily holds a row address and column address.

The command buffer 14-2 is electrically connected to the controller 17, and temporarily holds a control command.

The fuse register 15 is electrically connected to the input/output buffer 19 via a data bus line, and holds necessary data such as management data.

The power on reset circuit 16 senses the power on of this device, and outputs a reset signal to the controller 17.

The voltage generator 18 is electrically connected to the row decoder 11, column gate 12, and sense amplifier 13, and applies voltages necessary for these circuits under the control of the controller 19.

The input/output buffer 19 is electrically connected to the sense amplifier 13 and fuse register 15 via the data bus line, and temporarily holds data, addresses, and commands from an external apparatus such as a host apparatus.

The controller 17 controls the circuits described above. For example, the controller 17 performs data write, data read, and data erase by controlling the above-mentioned circuits.

1-2. Configuration Example of Memory Cell Array

Figure 2:
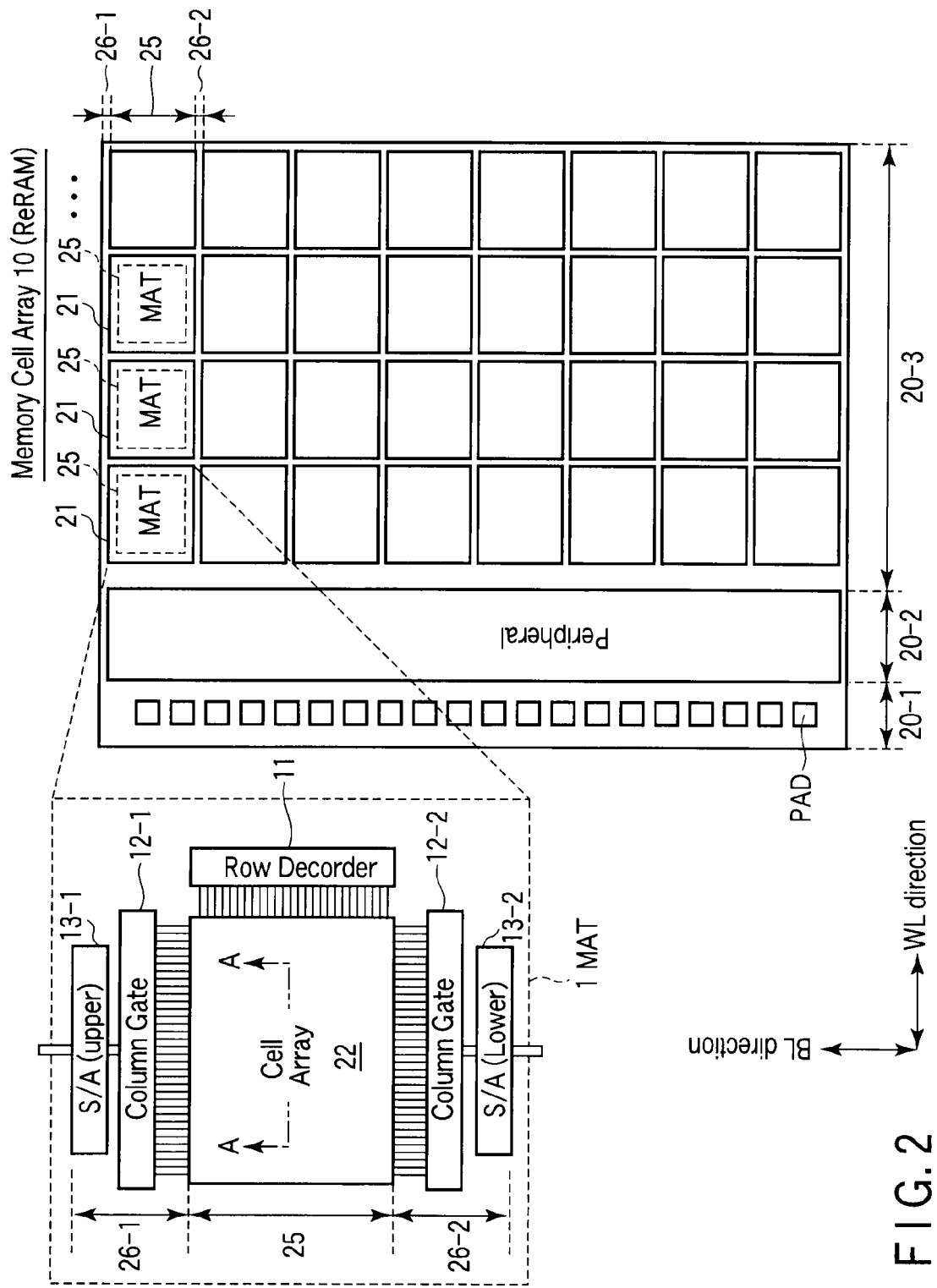
FIG. 2 is a plan view showing a memory cell array shown in FIG. 1.

An example of the configuration of the memory cell array 10 according to this embodiment will be explained below with reference to FIG. 2. As shown in FIG. 2, the memory cell array 10 according to this embodiment includes a plurality of MATs (mats) 21, a peripheral circuit 25, and PADs (pads).

The plurality of MATs 21 are arranged in a memory cell area 20-3. Also, as enclosed with the broken lines, each (one MAT) of the plurality of MATs 21 includes a cell array 22, column gates 12-1 and 12-2, sense amplifiers 13-1 and 13-2, and the row decoder 11.

The cell array 22 is arranged in a cell array area 27, and includes a plurality of memory cells to be randomly accessed arranged in a matrix at the intersections of a plurality of word lines and a plurality of bit lines.

The column gate 12-1 is arranged in the upper portion of the cell array 22 in a cell array peripheral area 26-1. The column gate 12-2 is formed in the lower portion of the cell array 22 in a cell array peripheral area 26-2.

The sense amplifier 13-1 is arranged in the upper portion of the column gate 12-1 in the cell array peripheral area 26-1. The sense amplifier 13-2 is arranged in the lower portion of the column gate 12-2 in the cell array peripheral area 26-2.

Note that the column gates 12-1 and 12-2 and sense amplifiers 13-1 and 13-2 may also be arranged on only one side.

Note also that the row decoder 11 is arranged beside the cell array 22 in the cell array peripheral area 26-1.

In this embodiment, the peripheral circuit 25 is arranged below each of the MATs 21. The peripheral circuit 25 is arranged in the surface region of a semiconductor substrate. Examples are a counter implanted well (to be described later), CMOS circuit, and capacitor. In a peripheral area 20-2, another peripheral circuit such as a data input/output circuit may also be arranged.

It is also possible to arrange the column gates 12-1 and 12-2, sense amplifiers 13-1 and 13-2, and row decoder 11 in the peripheral circuit 25.

The PADs (pads) are arranged in a PAD area 20-1. The pads include I/O pads 0 to 7 to which addresses and commands are input, and control pads such as a /CE pad to which a chip enable signal is input.

1-3. Circuit Configuration and Operation Example of Cell Array

Figure 3:
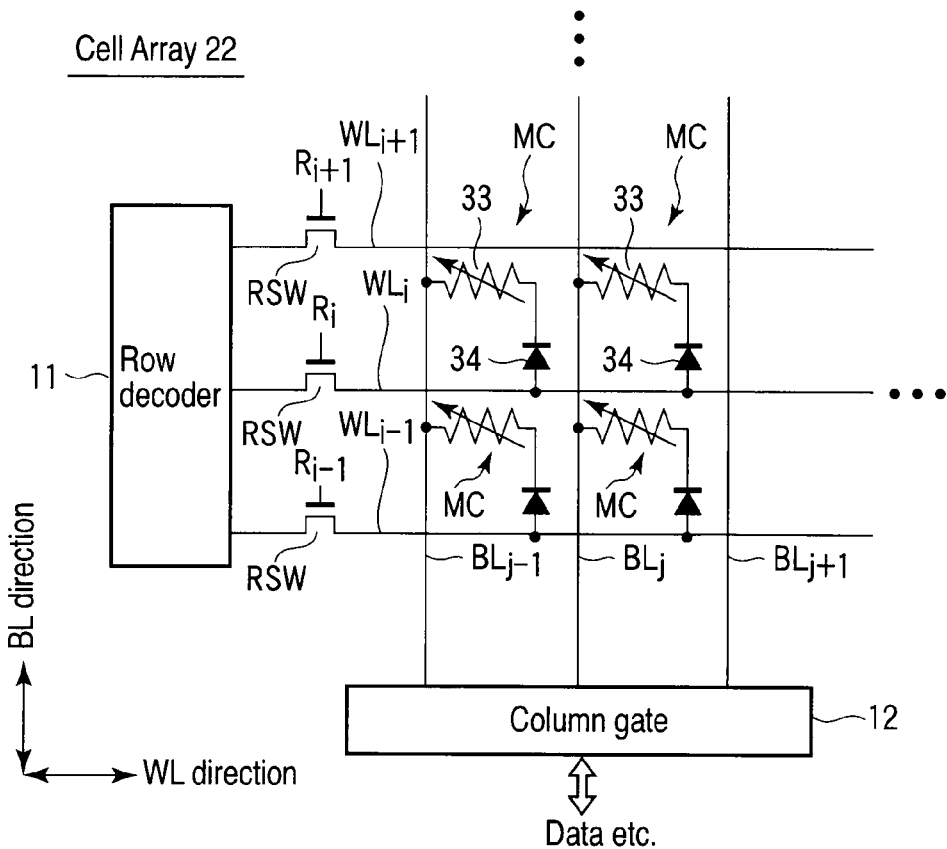
FIG. 3 is an equivalent circuit diagram showing a cell array shown in FIG. 2.

The circuit configuration and an example of the operation of the cell array 22 according to this embodiment will be explained below with reference to FIG. 3. As shown in FIG. 3, the cell array 22 according to this embodiment includes a plurality of memory cells MC to be randomly accessed arranged in a matrix at the intersections of a plurality of bit lines BLj−1 to BLj+1 and a plurality of word lines WLi−1 to WLi+1.

Each of the memory cells MC includes a variable resistance element 33 and diode 34. The current path of the variable resistance element has one end connected to one of the bit lines BLj−1 to BLj+1, and the other end connected to the cathode of the diode 34. The anode of the diode 34 is connected to one of the word lines WLi−1 to WLi+1.

One end of each of the word lines WLi−1 to WLi+1 is connected to the row decoder 11 via a MOS transistor RSW as a selection switch. One end of each of the bit lines BLj−1 to BLj+1 is electrically connected to the column gate 12 via a MOS transistor CSW as a selection switch.

Selection signals Ri−1, Ri, and Ri+1 each for selecting one word line (row) are input to the gates of the MOS transistors RSW. Selection signals Ci−1, Ci, Ci+1 each for selecting one bit line (column) are input to the gates of the MOS transistors CSW.

<Data Write Operation (Information Recording/Setting Operation)>

A data write operation of the memory cell MC will briefly be explained below.

Data can be written by applying a voltage to the variable resistance element 33 of a selected memory cell MC, and generating a potential gradient in the selected variable resistance element 33, thereby supplying an electric current. For example, a state in which the potential of the word line WLi is relatively lower than that of the bit line BLj is formed. Assuming that the bit line BLj is at a fixed potential (e.g., about 3 V), the ground potential need only be applied to the word line WLi.

Note that in this data write operation, unselected word lines WLi−1 and WLi+1 and unselected bit lines BLj−1 and BLj+1 are preferably all biased to the same potential. Note also that in a standby state before the data write operation, all the word lines WLi−1, WLi, and WLi+1 and all the bit lines BLj−1, BLj, and BLj+1 are preferably precharged. Furthermore, the voltage for information recording may also be generated by forming a state in which the potential of the word line WLi is relatively higher than that of the bit line BLj.

<Data Read Operation (Information Reproducing Operation)>

A data read operation is performed by, e.g., applying a voltage pulse to a selected variable resistance element 33, and detecting an electric current determined by the resistance of the memory cell MC. The voltage pulse desirably has a very small amplitude by which the material forming the variable resistance element 33 causes no state change.

For example, the data read operation is performed by applying a read voltage from the bit line BLj to a selected memory cell MC, and measuring the current value by the sense amplifier 13.

<Data Erase Operation <Resetting Operation)>

A data erase operation is performed by Joule-heating a selected variable resistance element 33 with a large-current pulse, thereby accelerating a redox reaction in the variable resistance element 33.

1-4. Configuration Example of Memory Cell

Figure 4:
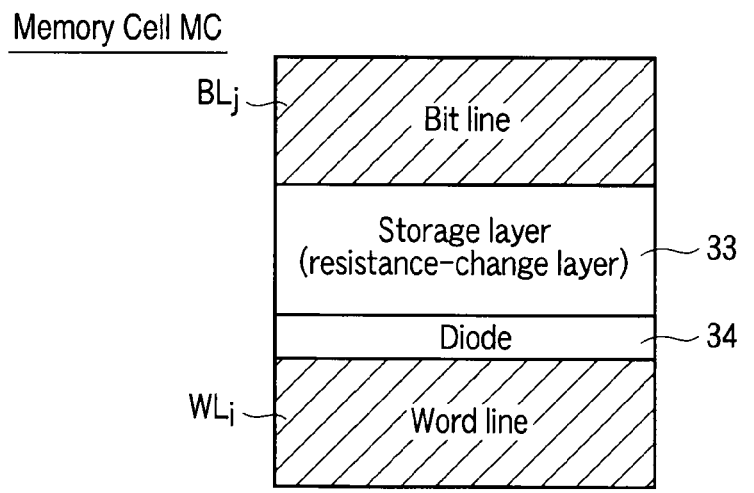
FIG. 4 is a sectional view showing a memory cell shown in FIG. 3.

An example of the configuration of the memory cell MC according to this embodiment will be explained below with reference to FIG. 4. As shown in FIG. 4, the memory cell MC according to this embodiment has a structure in which the storage layer (resistance-change layer) 33 functioning as a variable resistance element is stacked on the diode 34 between the bit line BLj and word line WLi.

1-5. Three-Dimensional Configuration Example of Memory Cell Array

Figure 5:
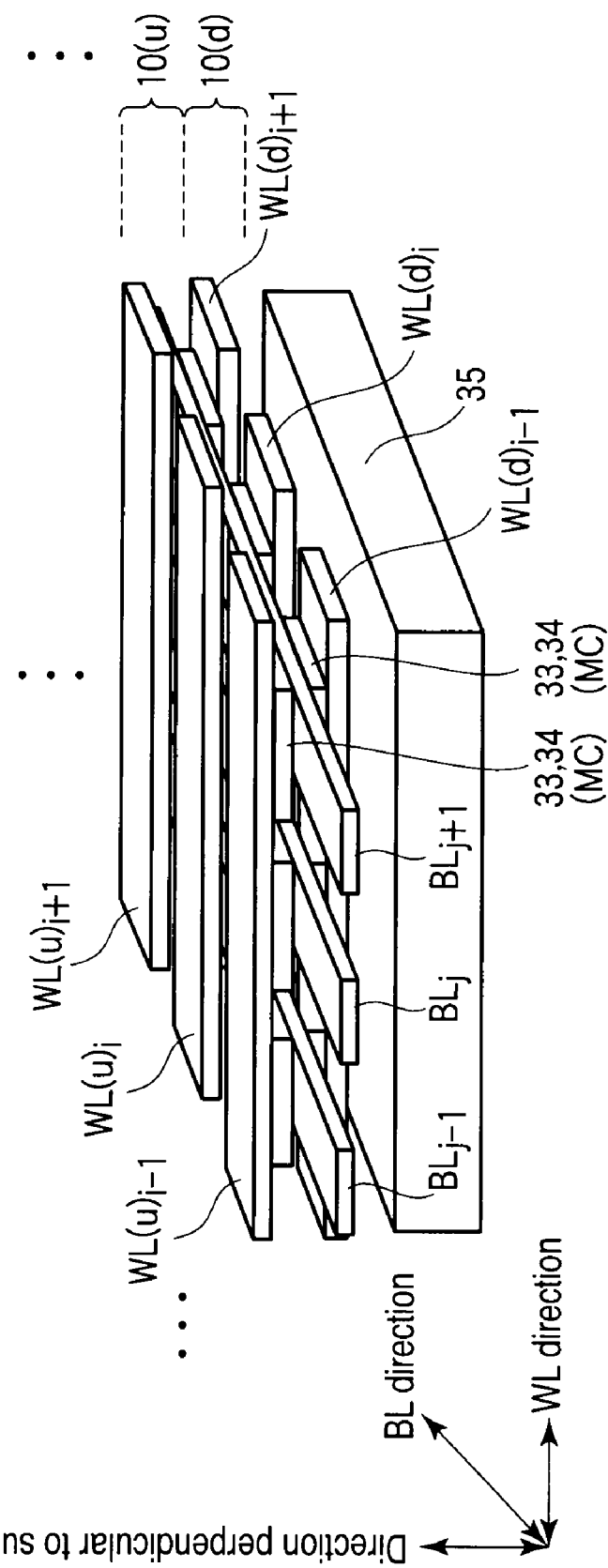
FIG. 5 is a perspective view showing the three-dimensional structure of the memory cell array.

An example of the three-dimensional configuration of the memory cell array 10 according to this embodiment will be explained below with reference to FIG. 5. As shown in FIG. 5, the memory cell array 10 according to this embodiment has a three-dimensional structure in which a plurality of layers (a memory cell array 10(d), memory cell array 10(u), . . . ) are stacked in a direction perpendicular to the substrate surface of a semiconductor substrate 35.

For example, in this embodiment as shown in FIG. 5, a plurality of memory cell arrays 10 are stacked in the direction perpendicular to the substrate surface of the semiconductor substrate 35. More specifically, in the direction perpendicular to the substrate surface of the semiconductor substrate 35, the first memory cell array 10(d) is formed at the intersections of word lines (WLi−1(d), WLi(d), and WLi+1(d)) and the bit lines (BLj−1, BLj, and BLj+1). In addition, the second memory cell array 10(u) is formed at the intersections of word lines (WLi−1(u), WLi(u), and WLi+1(u)) and the bit lines (BLj−1, BLj, and BLj+1).

As described above, the memory cell array 10 according to this embodiment has the three-dimensional structure in which the plurality of layers (the memory cell array 10(d), memory cell array 10(u), . . . ) are stacked in the direction perpendicular to the substrate surface of the semiconductor substrate 35. This is advantageous in increasing the capacity when compared to, e.g., a memory cell array having a two-dimensional structure in which only one layer is formed on a semiconductor substrate.

Note that the present invention is not limited to this embodiment, and it is also possible to form a three-dimensional structure by stacking three, four, . . . , and more memory cell arrays 10. Although not shown, a selection transistor for selecting one of the plurality of memory cell arrays, resistance elements, and the like exist below the above-mentioned memory cell arrays (the memory cell array 10(d), memory cell array 10(u), . . . ) (below the MATs) in the surface region of the semiconductor substrate 35.

1-6. Configuration Example of Surface Region of Semiconductor Substrate

First, a configuration example of the surface region of the semiconductor substrate according to the first embodiment will be explained below with reference to FIG. 6A. FIG. 6A is a sectional view of the surface region taken along a line A-A in FIG. 2. "+" of $N^+$ and $P^+$ indicates a high impurity concentration, and "−" of $N^−$ and $P^−$ indicates a low impurity concentration.

As shown in FIG. 6A, the periphery 25 and cell array 22 are formed in this order from the surface of the semiconductor substrate (Si(P)-sub) 35 according to this embodiment. In the periphery 25, an N-well resistance element is formed in an N-well resistance formation region 41-1, a PMOS transistor Tr1 is disposed in a PMOS formation region 41-2, an NMOS transistor Tr2 is disposed in an NMOS formation region 41-3, and an N-well capacitor C0 is disposed in an N-well capacitor formation region 41-4. A counter implanted well (second well) 44 is formed in the N-well resistance formation region 41-1 between the current paths of contact lines CL. That is, the N-well resistance element includes an element isolation insulating film STI, the counter implanted well 44, an N-well 43, $N^+$-wells 49, and the contact lines CL. The contact lines CL are connected to the upper surfaces of the $N^+$-wells 49, and the bottom surfaces of the $N^+$-wells 49 are connected to the N-well 43. Consequently, the contact lines CL and N-well 43 are electrically connected.

The element isolation insulating film STI in the N-well resistance formation region 41-1 is buried in a position shallower than the N-well (first well) 43 in the N-well 43.

In the N-well 43, the counter implanted well 44 has the bottom surface shallower than that of the N-well 43, i.e., has the bottom surface at the same position DP (DP<DN) as that of the bottom surface of the P-well 45. The counter implanted well 44 functions as a P-type ($P^−$) resistance element for increasing the resistance formed along the bottom surface of at least a portion of the element isolation insulating film STI. The counter implanted well 44 is offset at a predetermined distance (doff) from the two end portions of the element isolation insulating film STI. For example, the depth DP is desirably about 0.5 µm to about 1.2 µm. The rest will be described later.

The N-well (first well) 43 is an N-type impurity diffusion layer formed to have the bottom surface at a position DN deeper than the bottom surfaces of the resistance element 44 and P-well 45 in the semiconductor substrate 35. For example, the depth DN of the N-well 43 is desirably about 0.6 µm to about 2.0 µm.

The $N^+$-wells (third wells) 49 are N-type ($N^+$) impurity diffusion layers formed in the surface region of the N-well 43 so as to sandwich the element isolation insulating film STI along the channel length direction (in which an electric current flows through the resistance element). The side surfaces of the $N^+$-wells 49 are in contact with the side surfaces of the element isolation insulating film STI. The PMOS transistor Tr1 is disposed in the PMOS formation region 41-2 adjacent to the N-well resistance formation region 41-1 along the channel length direction, and functions as, e.g., a selection transistor for selecting one of the plurality of memory cell arrays described above. The PMOS transistor Tr1 includes an impurity diffusion layer 45P formed in the channel region of the N-well 43, a gate insulating film 46, a gate electrode G formed on the gate insulating film 46, spacers 47 disposed on the side surfaces of the gate electrode G, sources/drains ($P^+$) 45-1P formed to sandwich the gate electrode G, and contact lines CL. The impurity diffusion layer 45P is formed to adjust the threshold voltage of the PMOS transistor Tr1. Note that the N-well 43 is connected to contact lines (not shown) via the $N^+$-wells. Note also that the position of the bottom surface of the N-well 43 of the PMOS transistor Tr1 is almost the same as that of the bottom surface of the N-well 43 of the N-well resistance element.

The NMOS transistor Tr2 is disposed in the NMOS formation region 41-3 adjacent to the PMOS transistor Tr1 along the channel length direction, and makes a CMOS circuit together with the adjacent PMOS transistor. The NMOS transistor Tr2 includes a gate insulating film 46 on a P-well 45, a gate electrode G formed on the gate insulating film 46, spacers 47 formed on the side surfaces of the gate electrode G, sources/drains ($N^+$) 49-1N formed to sandwich the gate electrode G, and contact lines CL. The sources/drains 49-1N may also be formed simultaneously with the $N^+$-wells 49. In this case, the impurity concentration profile of the sources/drains 49-1N is almost the same as that of the $N^+$-wells 49 in the direction of depth of the P-type silicon substrate 35. Note that the P-well 45 is connected to contact lines (not shown) via p-type of sources/drains or a well.

In case the semiconductor substrate 35 is a P-type substrate, the bottom surface of the N-well 43 is preferably lower than that of the P-well 45. In case of disposing two NMOS transistors Tr2 in different P-wells 45, the N-well 43 is formed between the P-wells 45. This is so because the isolation between the P-wells 45 becomes insufficient if the bottom surface of the N-well 43 is lower than that of the P-well 45.

The N-well capacitor C0 is disposed in the N-well formation region 41-4 adjacent to the NMOS transistor Tr2 along the channel length direction, and functions as a capacitor having an arrangement similar to that of the transistor TR1 and including a gate insulating film 46 as an insulator.

Note that the counter implanted well 44, PMOS transistor Tr1, NMOS transistor Tr2, and N-well capacitor C0 are isolated by the element isolation insulating films STI. Note also that the side surface of the N-well 43 of the PMOS transistor Tr1 and that of the P-well 45 of the NMOS transistor Tr2 are in contact with each other below the element isolation insulating film STI.

An interlayer dielectric film 50 is formed to cover the configuration described above. Interconnection layers 51-1 and 51-2 electrically connected via vias Via1 and Via2 are formed in the interlayer dielectric film 50.

Also, the memory cell array 10 having the above-mentioned three-dimensional structure is stacked on the interlayer dielectric film 50 as will be described later.

Figure 6B:
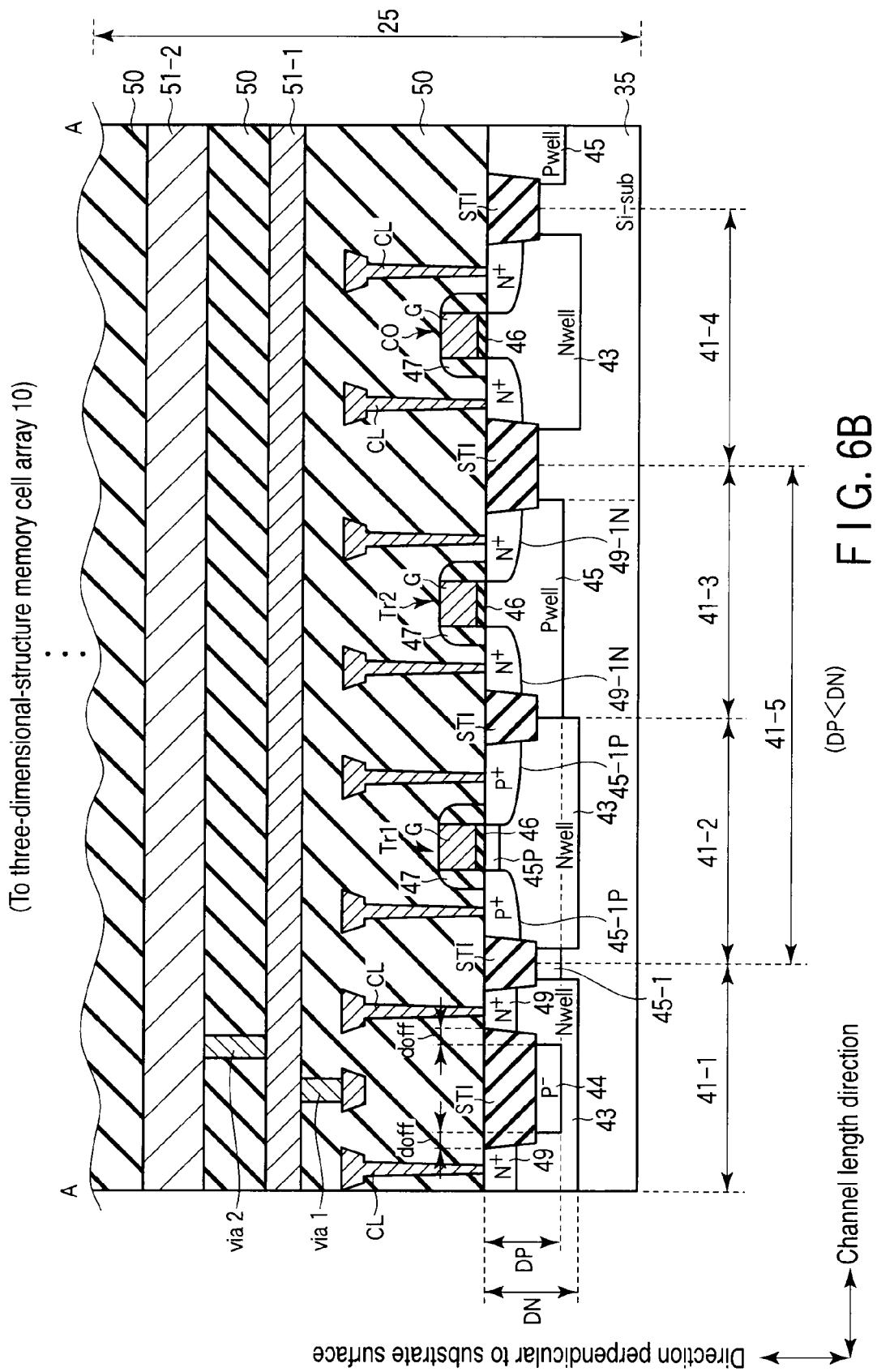
FIG. 6B is a sectional view showing a configuration example of a substrate surface region according to a modification.

As shown in FIG. 6B, a P-well 45-1 may be formed between the N-well 43 of the N-well resistance formation region 41-1 and the N-well 43 of the PMOS formation region 41-2. The upper surface of the P-well 45-1 contacts the bottom surface of the element isolation insulating film STI. The bottom surface of the P-well 45-1 is equal to the bottom surface of the P-well 45. This is because the P-well 45-1 is formed simultaneously with the P-well 45. Since the P-well 45-1 is formed between the N-well 43 of the N-well resistance formation region 41-1 and the N-well 43 of the PMOS formation region 41-2, the element isolation properties of the N-well 43 of the N-well resistance formation region 41-1 and the N-well 43 of the PMOS formation region 41-2 can be improved.

1-7. Configuration Example of Section of Memory Cell Array

Figure 7:
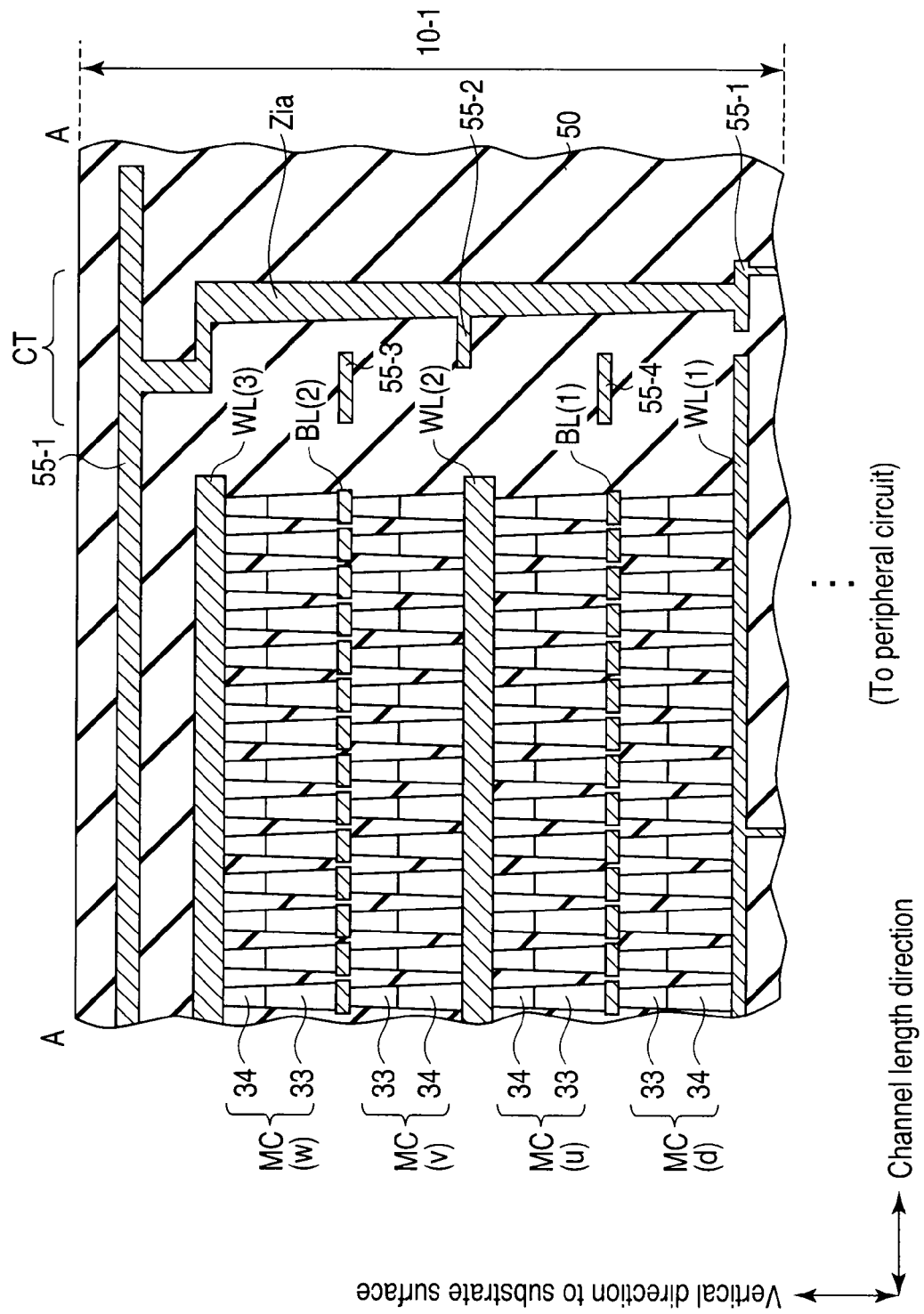
FIG. 7 is a sectional view showing a configuration example of the memory cell array taken along the line A-A in FIG. 2.

The configuration example of the memory cell array according to this embodiment will be explained in more detail below with reference to FIG. 7. FIG. 7 is a sectional view of the memory cell array taken along the line A-A in FIG. 2. More specifically, the structure shown in FIG. 7 is three-dimensionally placed on the upper-layer side of the surface region of the semiconductor substrate shown in FIG. 6A described above.

As shown in FIG. 7, the memory cell array 10 includes a plurality of memory cells MC three-dimensionally arranged on the upper-layer side of the peripheral circuit 25 in the direction perpendicular to the substrate. The plurality of memory cells MC are arranged in a matrix at the intersections of the word lines and bit lines. In this embodiment, four layers of the memory cells MC are three-dimensionally stacked. For example, a memory cell MC(d) is formed at the intersection of a word line WL(1) and bit line BL(1), a memory cell MC(u) is formed at the intersection of a word line WL(2) and the bit line BL(1), a memory cell MC(v) is formed at the intersection of a word line WL(3) and bit line BL(2), and a memory cell MC(w) is formed at the intersection of a word line WL(4) and the bit line BL(2). The bit lines BL(1) and BL(2) in the four layers are shared.

As described previously, each memory cell MC has a multilayered structure including the recording layer (resistance-change layer) 33 and diode 34. The recording layers 33 and diodes 34 of the memory cells MC(d) and MC(u) have a mirror-image relationship with each other with the shared bit line BL(1) being sandwiched between them. Likewise, the recording layers 33 and diodes 34 of the memory cells MC(v) and MC(w) have a mirror-image relationship with each other with the shared bit line BL(2) being sandwiched between them.

Interconnection layers 55-1 to 55-4 are arranged in the interlayer dielectric film 50, and electrically connect the memory cell array 10 to the peripheral circuit 25 and the like.

1-8. Counter Implanted Well

The configuration example of the counter implanted well 44 according to this embodiment will be explained in more detail below with reference to FIGS. 8, 9, and 10. Note that the element isolation insulating film is not shown in FIG. 8.

1-8-1. Configuration Example of Counter Implanted Well

Figure 8:
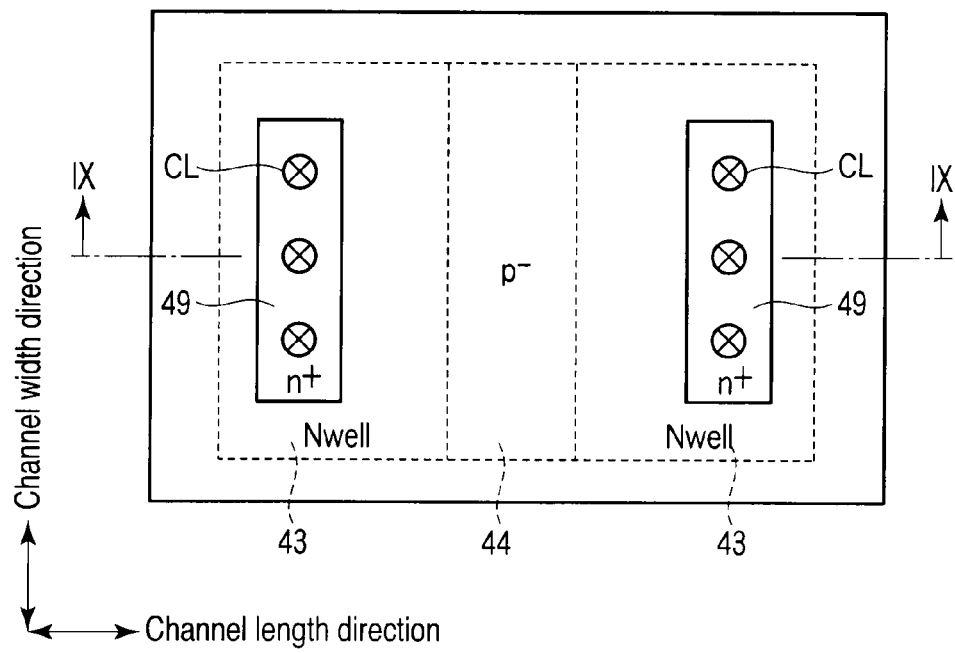
FIG. 8 is a plan view showing an counter implanted well formation region shown in FIG. 6.

FIG. 8 shows the planar structure of the counter implanted well 44. As shown in FIG. 8, the counter implanted well 44 is formed in the channel width direction along the bottom of at least a portion of the element isolation insulating film sandwiched between the contact lines CL and N-wells 43.

Figure 9:
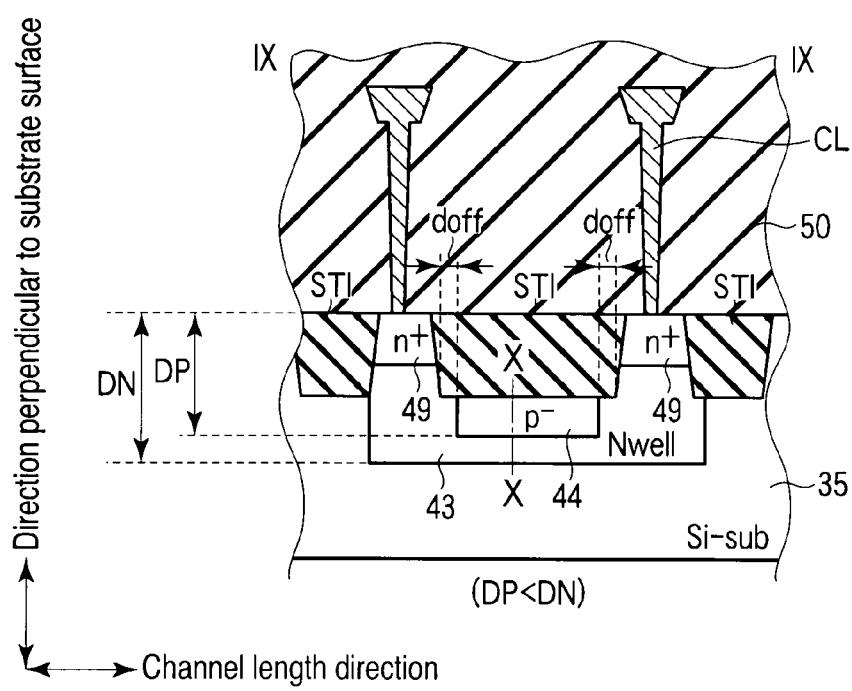
FIG. 9 is a sectional view taken along a line IX-IX in FIG. 8.

FIG. 9 shows the sectional structure of the counter implanted well 44. FIG. 9 is a sectional view taken along a line IX-IX in FIG. 8. As shown in FIG. 9, in the N-well 43, the counter implanted well 44 has the bottom surface shallower than that of the N-well 43, i.e., has the bottom surface at the same position DP (DP<DN) as that of the bottom surface of the P-well 45. The counter implanted well 44 functions as the P-type (P⁻) resistance element for increasing the resistance formed along the bottom surface of at least a portion of the element isolation insulating film STI.

In addition, the counter implanted well 44 is offset, along the channel length direction, at a predetermined distance (doff) from the two end portions of the element isolation insulating film STI in contact with the N⁺-wells 49. For example, the depth DP is desirably about 0.5 μm to about 1.2 μm.

Figure 10:
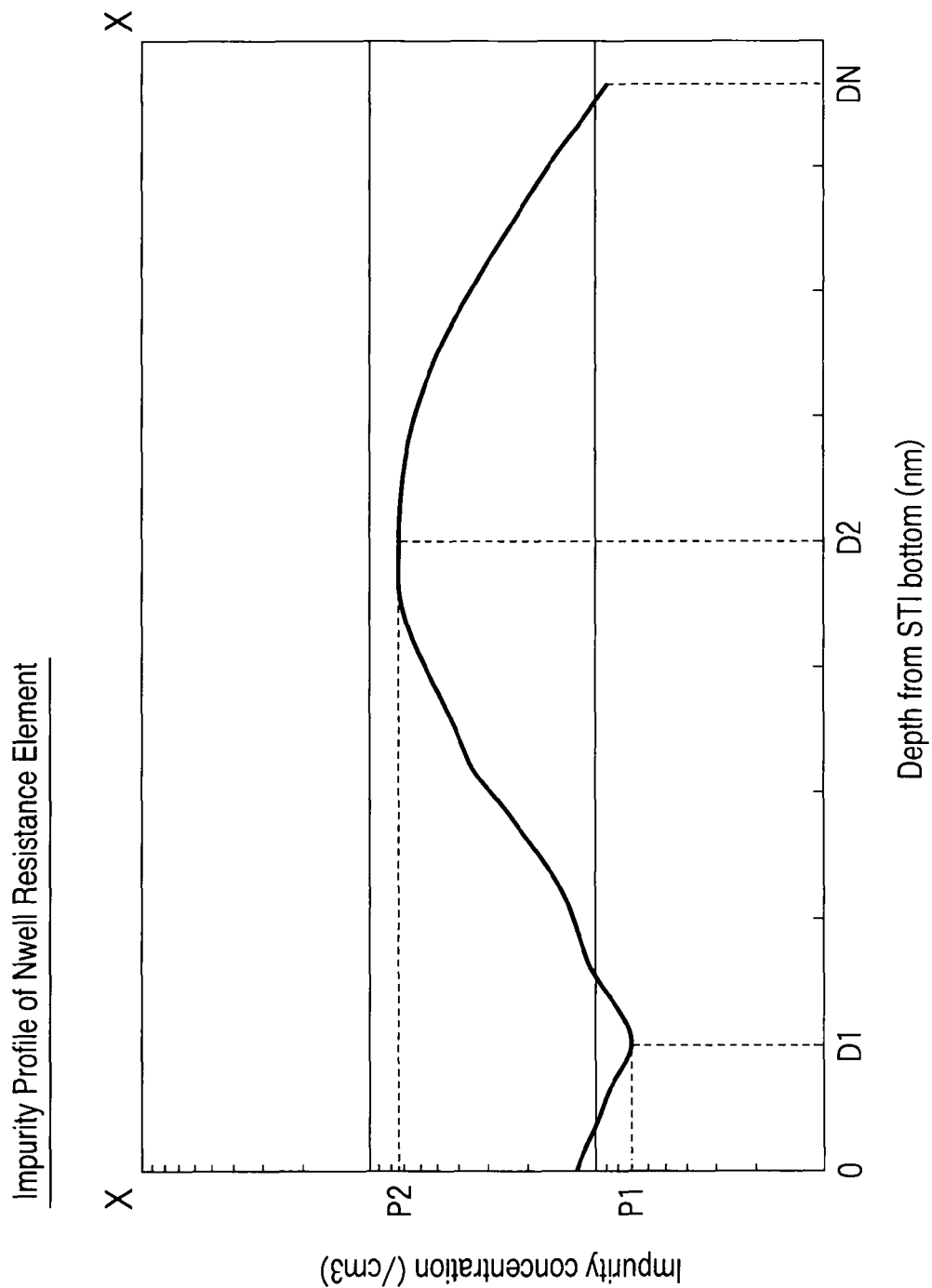
FIG. 10 is a graph showing an impurity concentration profile taken along a line X-X in FIG. 9.

FIG. 10 shows the impurity concentration profile of the counter implanted well 44. That is, FIG. 10 shows the total impurity concentration profile taken along a line X-X in FIG. 9, and indicates the relationship between the depth (nm) from the bottom of the STI (element isolation insulating film) and the impurity concentration (/cm³). The total impurity concentration is the difference between a p-type impurity concentration and n-type impurity concentration. Since the n-type impurity concentration is higher than the p-type impurity concentration in the counter implanted well 44, FIG. 10 shows the n-type impurity concentration. It is the result of calculating by the in-house simulator.

In this embodiment, an impurity concentration P1 at a depth D1 (about 100 nm) is about 1E+17 (/cm³). An impurity concentration P2 at a depth D2 (about 500 nm) is about 1E+18 (/cm³). The depth D1 is the position where the peak of the p-type impurity concentration in the N-well resistance formation region 41-1 exists. The depth D2 is the position where the peak of the n-type impurity concentration in the N-well 43 exists.

Also, the boundary between the N-well resistance formation region 41-1 and N-well 43 is, e.g., the position in case of B or In as a p-type impurity ion used in the formation of the N-well resistance formation region 41-1 is detected. In case the counter implanted well 44 is surrounded by the N-well 43, the conductivity type of the impurity concentration at the depth D1 may also be a p-type. This makes it possible to further increase the resistance of the resistance element.

1-8-2. Function of Counter Implanted Well

Figure 11:
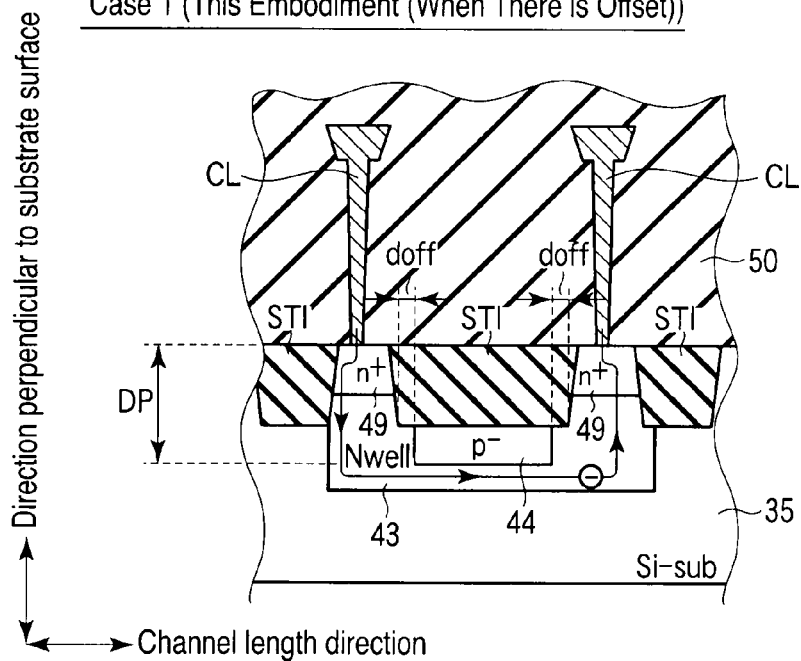
FIG. 11 is a sectional view for explaining the counter implanted well when an electric current is supplied according to the first embodiment.

The function of the counter implanted well 44 according to this embodiment will be explained below with reference to FIGS. 11 and 12.

Case 1 (this Embodiment (in Case of Offset))

First, the function of the counter implanted well 44 according to this embodiment will be explained with reference to FIG. 11. As shown in FIG. 11, the counter implanted well 44 according to this embodiment is offset at the predetermined distance (doff) from the two end portions of the element isolation insulating film STI along the channel length direction (a direction where the contact lines CL face each other). That is, no counter implanted well 44 is formed below the N⁺-wells 49.

In the operations such as data erase, program, and read of the semiconductor device having the three-dimensional structure according this embodiment, therefore, when electrons pass between the contact lines CL via the N-well 43, the electrons can be passed as they are kept away from the counter implanted well 44 having a low N-type impurity concentration in those portions of the N⁺-wells 49 and N-well 43 which are sandwiched between the element isolation insulating films STI. This makes it possible to reliably ensure the electrical connection between the N⁺-wells 49 and N-well 43.

Case 2 (in Case of No Offset ("Non-Masked Implantation"))

Figure 12:
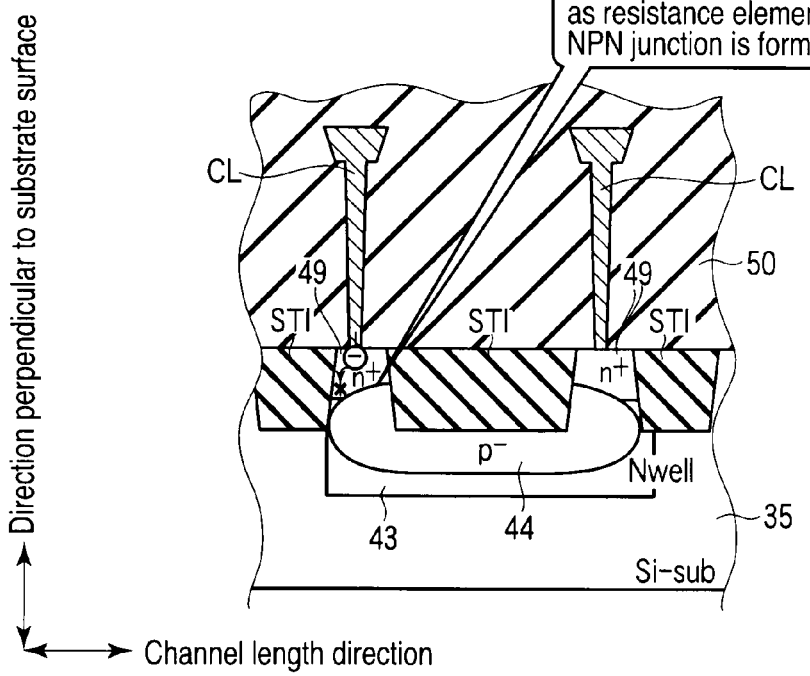
FIG. 12 is a sectional view for explaining a counter implanted well when an electric current is supplied with a P-type impurity being doped by non-masked implantation.

On the other hand, FIG. 12 shows a case in which there is no offset; a P-type impurity for forming the counter implanted well 44 is doped by so-called "non-masked implantation" and thermally diffused after that. In this structure, an NPN junction may be formed between the N⁺-wells 49, counter implanted well 44, and N-well 43 in the portions sandwiched between the element isolation insulating films STI.

In the operations such as data erase, program, and read, therefore, when electrons pass between the contact lines CL via the N-well 43, the electrons cannot be passed as they are kept away from the counter implanted well 44 in those portions of the N⁺-wells 49 and N-well 43 which are sandwiched between the element isolation insulating films STI. Accordingly, it is impossible to secure the electrical connection between the N⁺-wells 49 and N-well 43, and cause the counter implanted well 44 to normally function as the resistance element for increasing the resistance.

As will be disclosed in a modification (to be described later), however, even when there is no offset, it is possible to cause the counter implanted well 44 to normally function as long as a portion where no inverting layer 44 is formed exists below the N⁺-well 49.

<2. Manufacturing Method>

A method of manufacturing the semiconductor memory device according to this embodiment will be explained below with reference to FIGS. 13, 14, 15, and 16A. This explanation will be made by taking the configuration example of the surface region of the semiconductor substrate shown in FIG. 6A as an example.

Figure 13:
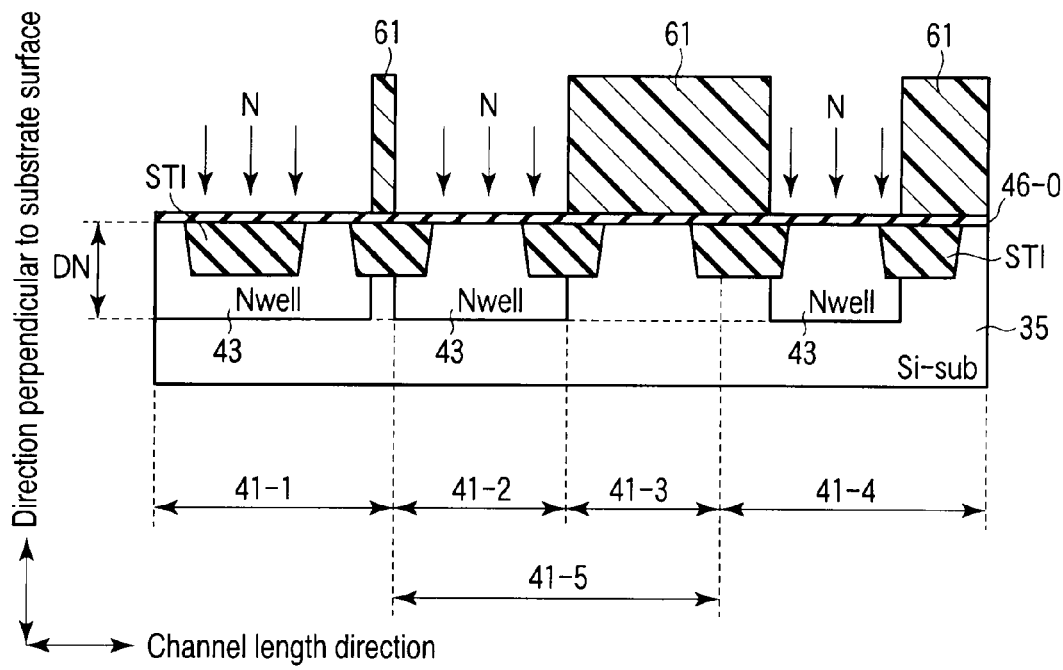
FIG. 13 is a sectional view showing a manufacturing step of the semiconductor memory device according to the first embodiment.

As shown in FIG. 13, a P-type silicon substrate 35 having an impurity concentration of about $1\times10^{14}$ to $1\times10^{16}$ cm⁻³ is cleaned. A silicon oxide film, silicon nitride film, or the like is buried in trenches formed in element isolation regions, thereby forming an element isolation insulating film STI (Shallow Trench Isolation) structure. The trench depth is, e.g., about 100 to 400 nm.

A sacrificial oxide film 46-0 is formed within the range of, e.g., about 2 to 20 nm by thermal oxidation on the semiconductor substrate 35 and on the element isolation insulating films STI. The sacrificial oxide film 46-0 is formed to, e.g., reduce surface damage caused by ion implantation in later steps, and prevent substrate contamination and a resist fall that occurs during lithography.

The sacrificial oxide film 46-0 is coated with a photoresist 61 in order to form N-wells of a counter implanted well, P-channel transistor, and N-well capacitor. The photoresist 61 is exposed and developed to form an opening pattern that exposes the surfaces of an N-well resistance formation region 41-1, PMOS formation region 41-2, and N-well capacitor formation region 41-3. The photoresist 61 having the opening pattern described above is used as a mask to ion-implant an N-type impurity such as P or As in the semiconductor substrate 35 at an energy of abut 80 to 1,000 keV and an impurity dose of $1.0\times10^{12}$ to $1\times10^{14}$ cm⁻², thereby forming N-wells 43. Note that this implantation may also be divisionally performed a plurality of number of times.

Since the N-wells 43 of the P-channel transistor and N-well resistance element are simultaneously formed, the bottom surfaces of the N-wells 43 of the P-channel transistor and N-well resistance element are at almost the same position. After that, the photoresist 61 is removed by ashing or processing using a liquid chemical mixture containing sulfuric acid and hydrogen peroxide.

Figure 14:
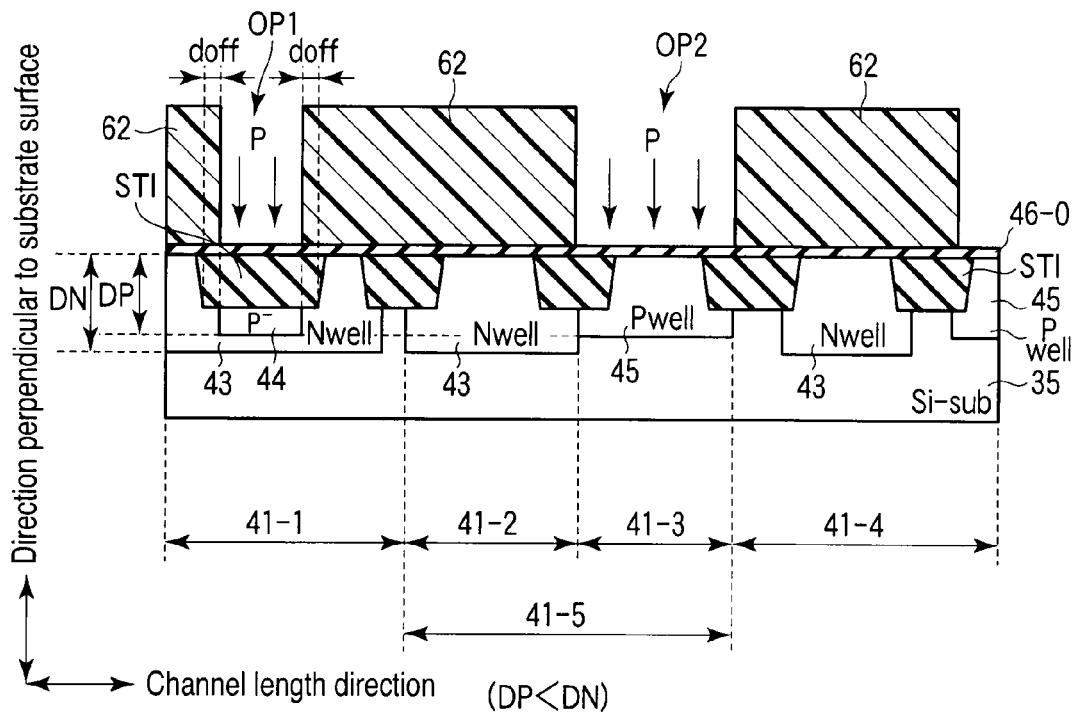
FIG. 14 is a sectional view showing another manufacturing step of the semiconductor memory device according to the first embodiment.

As shown in FIG. 14, the sacrificial oxide film 46-0 is coated with a photoresist 62 in order to form P-wells of the counter implanted well and an N-channel transistor. The photoresist 62 is then exposed and developed to form opening patterns OP1 and OP2 that expose the semiconductor surfaces of the N-well resistance formation region 41-1 and NMOS formation region 41-3. When forming the opening pattern OP1, the exposure conditions and development conditions are selected so as to offset the opening pattern OP1 at a predetermined distance (doff) from the two end portions of the element isolation insulating film STI.

The photoresist 62 having the above-mentioned opening patterns is used as a mask to ion-implant a P-type impurity such as B or In in the semiconductor substrate 35 at an energy of about 50 to 800 keV and an impurity concentration of $1\times10^{12}$ to $1\times10^{14}$ cm$^{-2}$, thereby performing "overlap implantation" of the P-type impurity in the N-wells 43 below the bottom surfaces of the element isolation insulating films STI. Consequently, a counter implanted well 44 for increasing the resistance is formed, and a P-well 45 is formed in the semiconductor substrate 35. The setting conditions such as the ion implantation energy are selected so that a depth DP of the counter implanted well 44 and P-well 45 is shallower than a depth DN of the N-wells 43 (DP<DN). Note that this implantation may also be divisionally performed a plurality of number of times.

In this step, the counter implanted well 44 is formed by performing "overlap implantation" of the P-type impurity in the N-well 43. That is, the effective N-type impurity concentration in the N-well 43 can be decreased by the two-stage ion implantation step using the N-type impurity and P-type impurity. This makes it possible to form the counter implanted well 44 for increasing the N-well resistance. In addition, since the P-well 45 is formed simultaneously with the counter implanted well 44, the resistance of only the counter implanted well can be increased while the latch-up resistance between a P-channel transistor Tr1 and N-channel transistor Tr2 is maintained. Furthermore, In case a plurality of P-channel transistors Tr1 are formed, the P-wells 45 between the P-channel transistors Tr1 can reliably be isolated by forming the N-wells 43 between the P-wells 45, because the depth DP of the P-well 45 is shallower than the depth DN of the N-wells 43.

Since the counter implanted well 44 can be formed simultaneously with the P-well 45, the number of masks does not increase, so the number of manufacturing steps does not increase either. This is advantageous in that the manufacturing cost can be reduced. The bottom surfaces of the P-well 45 and counter implanted well 44 are at almost the same position because the P-well 45 of the N-channel transistor and the counter implanted well 44 of the counter implanted well are formed at the same time.

After this step is performed, the p-type impurity exists in the element isolation insulating film STI on the counter implanted well 44.

The photoresist 62 is removed by ashing or processing using a liquid chemical mixture containing sulfuric acid and hydrogen peroxide.

As shown in FIG. 15, the sacrificial oxide film 46-0 is coated with a photoresist 63, and the photoresist 63 is exposed and developed to form an opening pattern that exposes the semiconductor surface of the PMOS formation region 41-2.

The photoresist 63 having the above-mentioned pattern is used as a mask to ion-implant a P-type impurity such as B, BF$_2$, or In at an impurity dose of about $2\times10^{11}$ to $1\times10^{13}$ cm$^{-2}$ and an acceleration energy of about 5 to 20 keV, thereby forming a P-type impurity diffusion layer 45P for threshold adjustment in the surface of the P-channel transistor Tr1.

The photoresist 63 is removed by ashing or processing using a liquid chemical mixture containing sulfuric acid and hydrogen peroxide.

As shown in FIG. 16A, known manufacturing steps are used to form gate oxide films 46, gate electrodes G, spacers 47, sources/drains (N$^+$ and P$^+$), and N$^+$-wells 49 on the semiconductor substrate 35 in predetermined formation regions.

Figure 16B:
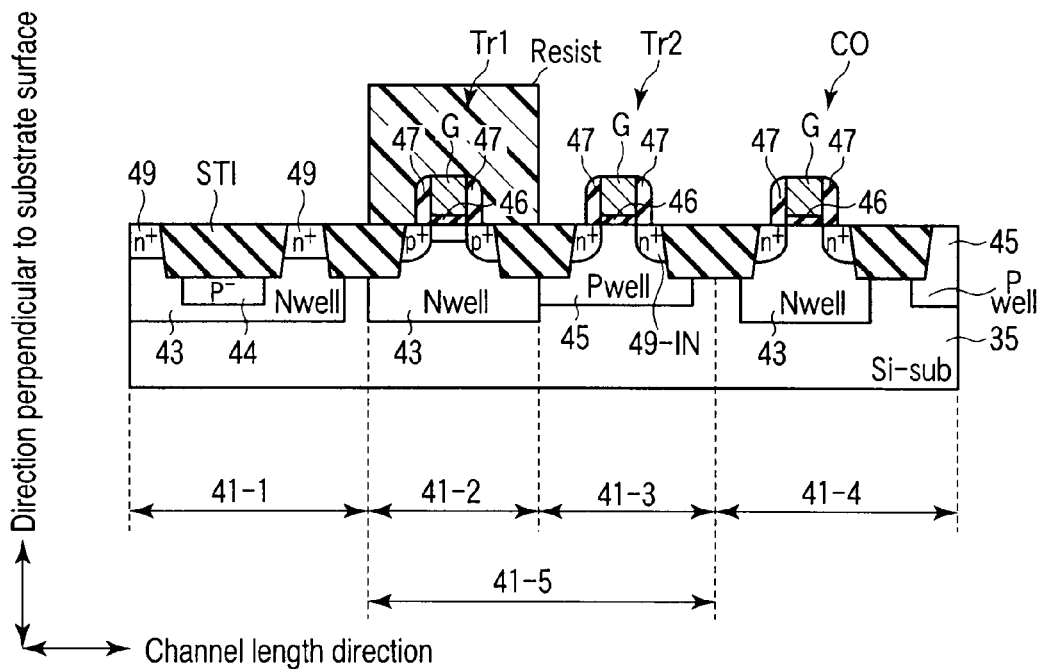
FIG. 16B is a sectional view showing a manufacturing step of a semiconductor memory device according to a modification.

In case of simultaneously forming the sources/drains (N$^+$-wells 49-1N) and the N$^+$-wells 49, the PMOS formation region 41-2 is covered with a photoresist, as shown in FIG. 16B, and N-type impurity ions are implanted in the P-type silicon substrate 35 by ion implantation using the photoresist and the gate electrodes G as masks. Since the bottom surfaces of the N$^+$-wells 49-1N and 49N are shallower than that of the element isolation insulating film STI, the impurity concentration of the counter implanted well 44 formed at the bottom surface of the well resistance formation region 41-1 is rarely affected. After that, the photoresist is removed by ashing or processing using a liquid chemical mixture containing sulfuric acid and hydrogen peroxide.

An interlayer dielectric film 50, contact lines CL, vias Via1 and Via2, and interconnection layers 51-1 and 51-2 are formed, thereby manufacturing the arrangement of the peripheral circuits in the surface region of the semiconductor substrate shown in FIG. 6A.

The semiconductor memory device according to this embodiment is manufactured by forming a three-dimensional-structure memory cell array on the interlayer dielectric film 50.

<3. Effects>

The semiconductor memory device and the manufacturing method of the same according to this embodiment achieve at least effects (1) to (3) below.

(1) The embodiment is advantageous against the increase in power consumption.

In a semiconductor memory device having a three-dimensional structure, the power consumption may increase as the degree of integration increases.

In the arrangement according to this embodiment, however, in the N-well 43 of the N-well resistance element, the P-type (P$^-$) counter implanted well 44 for increasing the resistance is formed along the bottom surface of at least a portion of the element isolation insulating film STI, at the same position DP (DP<DN) as that of the P-well 45 shallower than the N-well 43. Also, the counter implanted well 44 is offset at the predetermined distance (doff) from the two end portions of the element isolation insulating film STI.

As explained above with reference to FIGS. 11 and 12, therefore, in the operations such as data erase, program, and read of the three-dimensional-structure semiconductor device according to this embodiment, even when electrons pass between the contact lines CL via the N-well 43, these electrons can be passed as they are kept away from the counter implanted well 44. This makes it possible to reliably connect the N$^+$-wells 49 and N-well 43.

Accordingly, the reliability can be improved even when a high voltage is applied to the N-well 43 as the degree of integration increases. This is advantageous against the increase in power consumption.

(2) It is possible to increase the resistance of only the counter implanted well 44 while maintaining the latch-up resistance.

As shown in FIG. 14, the counter implanted well 44 is formed by performing "overlap implantation" in the N-well 43 by the impurity implantation energy. That is, the effective N-type impurity concentration in the N-well 43 can be decreased by the two-stage ion-implantation step using the N-type impurity and P-type impurity. Accordingly, the counter implanted well 44 can be formed by increasing the resistance of only the counter implanted well 44 formation region. On the other hand, the resistance of the N-well 43 of the P-channel transistor Tr1 does not rise. Consequently, it is possible to increase the resistance of only the counter implanted well while maintaining the latch-up resistance of the CMOS formed by the P-channel transistor Tr1 and N-channel transistor Tr2.

(3) The embodiment is advantageous in that the manufacturing cost can be reduced.

Since the counter implanted well 44 can be formed simultaneously with the P-well 45, the number of masks does not increase, so the number of manufacturing steps does not increase either. This makes it possible to decrease the process load. Therefore, the embodiment is advantageous in that the manufacturing cost can be reduced. Also, the counter implanted well 44 and P-well 45 are simultaneously formed, and the N-well having the bottom surface lower than those of these wells is formed. As a consequence, it is possible to obtain a high well resistance, and reliably isolate the P-wells 45.

(4) The embodiment is advantageous for shrinking.

The chip area of a three-dimensional-structure memory such as a ReRAM can be reduced by applying the counter implanted well 44 to the ReRAM. For example, the ReRAM has a circuit element such as a sense amplifier for each MAT. Also, the N-well resistance element is formed in the peripheral circuit 25 formed below the MAT 21. If the N-well resistance element extends from below the MAT 21 in a plan view, the N-well resistance element is disposed across a plurality of MATs 21. This makes the layout difficult. That is, the N-well resistance element is preferably formed within the range below the MAT 21.

On the other hand, if the N-well resistance element is shrank, the resistance of the N-well resistance element decreases, so the design requirement cannot be met any longer. Consequently, the area of the memory cell array increases due to the N-well resistance element. In case of using the counter implanted well 44 so as to increase the resistance of the N-well resistance element, therefore, it is possible to satisfy the required resistance value, and disposed the N-well resistance element within the range below the MAT 21. As a result, the area of the memory cell array can be reduced.

[Modification]

A semiconductor memory device according to a modification will be explained below with reference to FIG. 17. This modification is directed to an example capable of normally functioning without any offset. In this explanation, a repetitive explanation of the same portions as in the first embodiment will be omitted.

Figure 17:
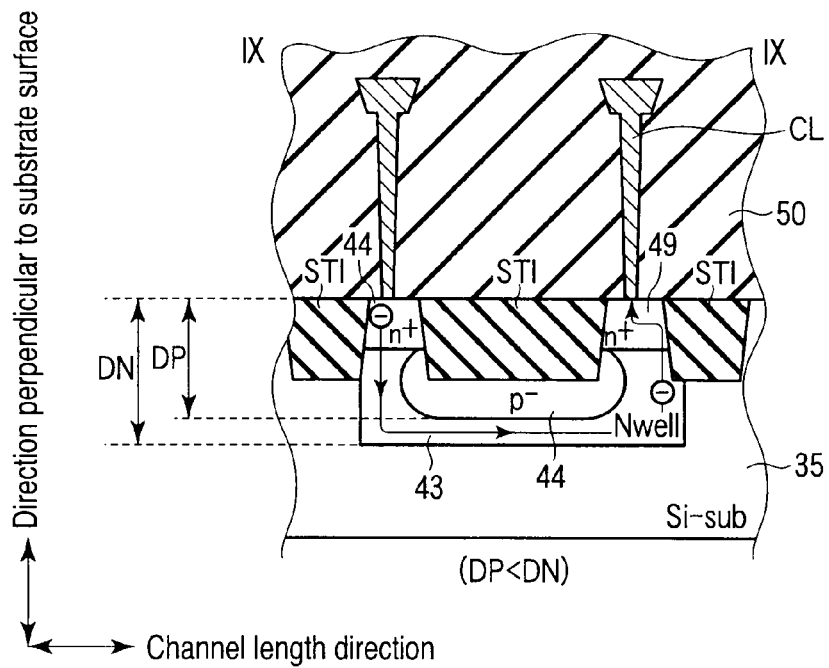
FIG. 17 is a sectional view showing a counter implanted well of a semiconductor memory device according to a modification of the present invention.

As shown in FIG. 17, a counter implanted well (second well) 44 according to this modification differs from the first embodiment in that the counter implanted well 44 has no offset.

Even when there is no such offset as described previously, however, it is possible to secure the connection between $N^+$-wells 49 and an N-well 43 and cause the N-well resistance to normally function, provided that there is even a portion where the counter implanted well 44 is not formed below the $N^+$-well 49. In this structure, adjustment so that a depletion layer in the connecting portion of the counter implanted well 44 and N-well 43 does not cover the connecting portions of the $N^+$-wells 49 and N-well 43 sandwiched between element isolation insulating films STI.

The structure according to this modification achieves at least the same effects as effects (1) to (4) described above. In addition, the resistivity of the N-well resistance element can further be increased because the counter implanted well 44 has no offset.

Comparative Example

Example Including No Counter Implanted Well

A method of manufacturing a semiconductor memory device according to a comparative example will be explained below with reference to FIGS. 18, 19, 20, and 21. This comparative example is directed to an example not including the counter implanted well according to the above-mentioned first embodiment. In this explanation, a repetitive explanation of the same portions as in the first embodiment will be omitted.

<Manufacturing Method>

A P-type silicon substrate 135, for example, is cleaned as shown in FIG. 18. Insulating films are buried in trenches formed in element isolation regions, thereby forming element isolation insulating films STI.

A sacrificial oxide film 146-0 is formed on the semiconductor substrate 135 and on the element isolation insulating films STI by thermal oxidation.

The sacrificial oxide film 146-0 is coated with a photoresist 161. The photoresist 161 is then exposed and developed to form an opening pattern that exposes the surfaces of an N-well resistance formation region 141-1, PMOS formation region 141-2, and N-well capacitor formation region 141-3. The photoresist 161 having the opening pattern described above is used as a mask to ion-implant an N-type impurity such as P or As in the semiconductor substrate 135, thereby forming N-wells 143. The photoresist 161 is removed by ashing or processing using a liquid chemical mixture containing sulfuric acid and hydrogen peroxide.

As shown in FIG. 19, the sacrificial oxide film 146-0 is coated with a photoresist 162. The photoresist 162 is exposed and developed to form an opening pattern that exposes the semiconductor surface of the NMOS formation region 141-3.

The photoresist 162 having the above-mentioned opening pattern is used as a mask to ion-implant a P-type impurity in the semiconductor substrate 135, thereby forming P-wells 145.

In the steps according to this comparative example, the pattern of the photoresist 162 and the configuration of the element isolation insulating films STI make it impossible to form any counter implanted well in the N-well 143. The photoresist 162 is removed by ashing or processing using a liquid chemical mixture containing sulfuric acid and hydrogen peroxide.

Figure 20:
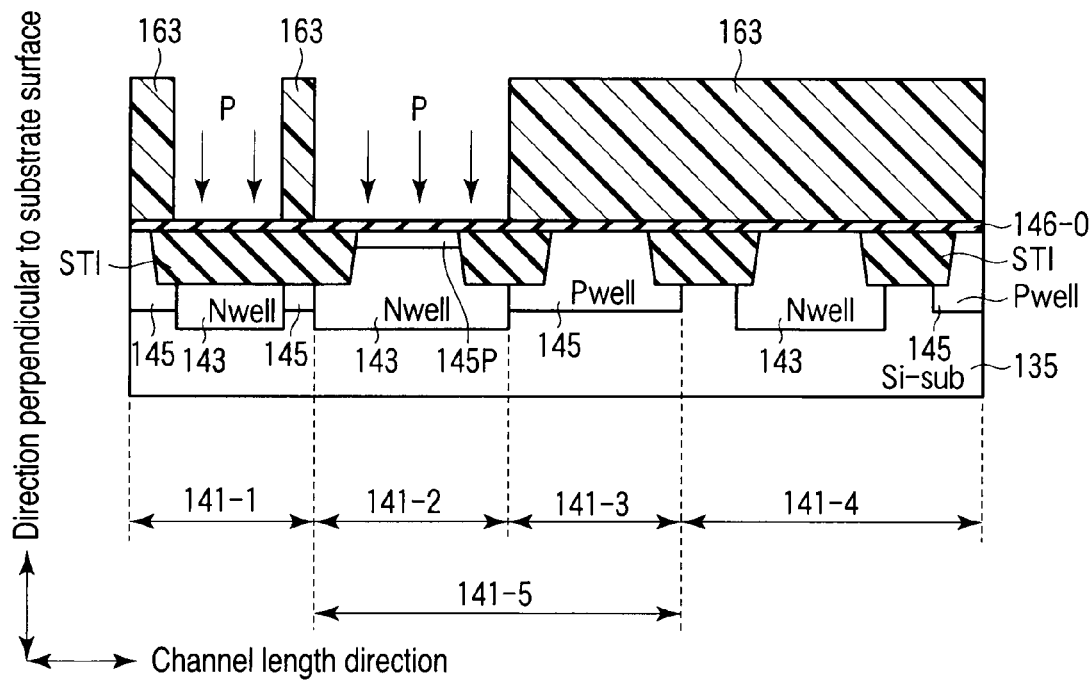
FIG. 20 is a sectional view showing still another manufacturing step of the semiconductor memory device according to the comparative example of the present invention.

As shown in FIG. 20, the sacrificial oxide film 146-0 is coated with a photoresist 163, and the photoresist 163 is exposed and developed to form an opening pattern that exposes the semiconductor surfaces of the N-well resistance formation region 141-1 and PMOS formation region 141-2.

The photoresist 163 having the above-mentioned pattern is used as a mask to ion-implant a P-type impurity in the surface of the semiconductor substrate 135, thereby forming a P-type impurity diffusion layer 145P for threshold adjustment in the channel surface of a P-channel transistor Tr11. The photoresist 163 is removed by ashing or processing using a liquid chemical mixture containing sulfuric acid and hydrogen peroxide.

Figure 21:
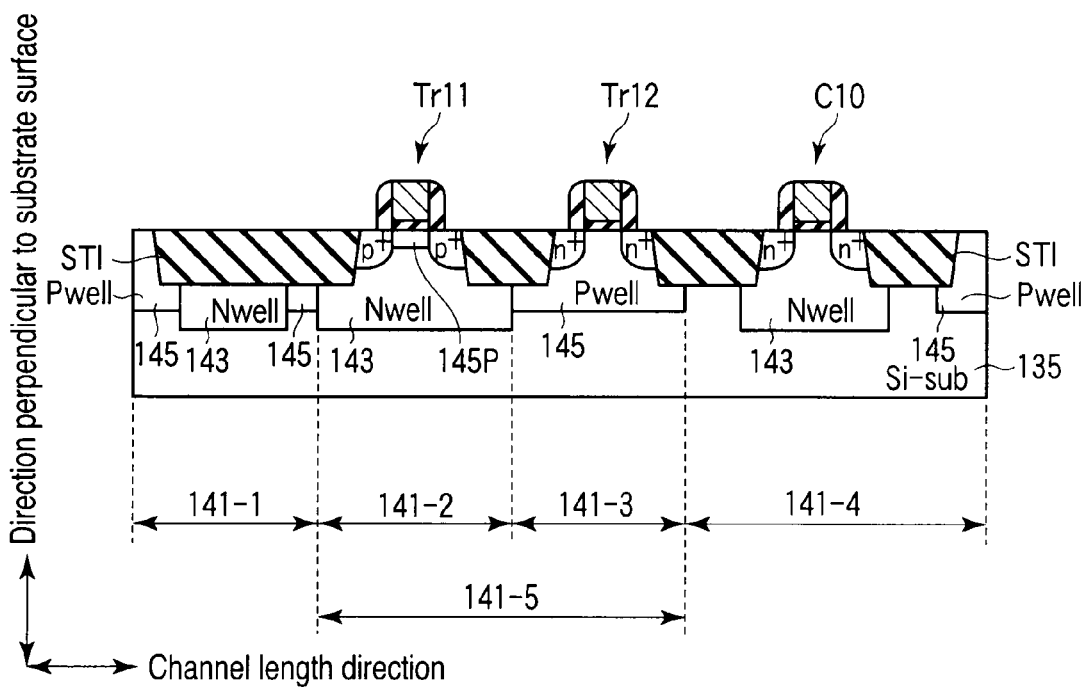
FIG. 21 is a sectional view showing still another manufacturing step of the semiconductor memory device according to the comparative example of the present invention.

As shown in FIG. 21, known manufacturing steps are used to form gate oxide films, gate electrodes, spacers, and sources/drains ($N^+$ and $P^+$) on the semiconductor substrate 135 in predetermined formation regions, thereby forming the transistors Tr11, a transistor Tr12, and a capacitor C10.

As described above, the arrangement and its manufacturing method according to this comparative example cannot form the counter implanted well 44 according to the first embodiment described above.

Accordingly, the arrangement according to this comparative example cannot increase the N-well resistance. Consequently, the reliability degrades, and this is disadvantageous against the increase in power consumption.

This makes the method of manufacturing the arrangement according to this comparative example unable to achieve effects (2) and (3) described earlier.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of memory cell arrays each comprising a plurality of memory cells, the plurality of memory cell arrays being stacked on a semiconductor substrate to form a three-dimensional structure;
a first well formed in the semiconductor substrate and having a first conductivity type;
an element isolation insulating film including a bottom surface shallower than a bottom surface of the first well in the first well, and buried in the semiconductor substrate;
a second well including a bottom surface shallower than the bottom surface of the first well in the first well, formed along a bottom surface of at least a portion of the element isolation insulating film, and made of an impurity having a second conductivity type; and
a contact line electrically connected to the first well.

2. The device of claim 1, further comprising a third well which is formed in a surface region of the first well in contact with a side surface of the element isolation insulating film, includes an upper surface connected to the contact line, and has the first conductivity type.

3. The device of claim 2, wherein an end portion of the second well is offset from an end portion of the element isolation insulating film in contact with the third well.

4. The device of claim 1, further comprising a first transistor which is disposed adjacent to the second well, comprises a well whose bottom surface is equal to the bottom surface of the first well, and has the second conductivity type.

5. The device of claim 4, further comprising a second transistor disposed adjacent to the first transistor, making a CMOS circuit together with the first transistor, and having the first conductivity type.

6. The device of claim 5, further comprising a capacitor which is disposed adjacent to the second transistor, includes a well whose bottom surface is leveled with the bottom surface of the first well, has the first conductivity type, and includes a gate insulating film as an insulator.

7. The device of claim 5, wherein a bottom surface of the well of the second transistor is equal to that of the second well.

8. The device of claim 1, wherein
the plurality of memory cell arrays comprise a plurality of MATs arranged in a memory cell area, and
the second well is formed within a range below one of the plurality of MATs.

9. The device of claim 8, wherein the memory cell comprises:
a variable resistance element whose current path has one end connected to a bit line; and
a diode comprising a cathode connected to the other end of the current path of the variable resistance element, and an anode connected to a word line.

10. The device of claim 1, wherein in impurity concentration profiles of the first well and the second well obtained in a direction of depth from the bottom of the element isolation insulating film,
the first well has a first peak of a concentration of the impurity having the first conductivity type, and
the second well has a second peak of a concentration of the impurity having the second conductivity type, and
a depth of the first peak is deeper than a depth of the second peak.

11. The device of claim 1, which further comprises a third well formed in a surface region of the first well in contact with a side surface of the element isolation insulating film, including an upper surface connected to the contact line, and having the first conductivity type, and
in which an end portion of the second well is not offset from an end portion of the element isolation insulating film in contact with the third well, and a portion where the second well is not formed is formed below the third well.

* * * * *